(12) United States Patent
Nunnally et al.

(10) Patent No.: US 7,233,261 B2
(45) Date of Patent: *Jun. 19, 2007

(54) MICROWAVE FREQUENCY ELECTRO-OPTICAL BEAM DEFLECTOR AND ANALOG TO DIGITAL CONVERSION

(75) Inventors: William Nunnally, Columbia, MO (US); John Gahl, Columbia, MO (US); Timothy Renkoski, Ballwin, MO (US)

(73) Assignee: The Curators of the University of Missouri, Columbia, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/949,030

(22) Filed: Sep. 24, 2004

(65) Prior Publication Data

US 2006/0072186 A1 Apr. 6, 2006

(51) Int. Cl.
*H03M 1/22* (2006.01)
(52) U.S. Cl. .................... 341/13; 341/155; 341/137
(58) Field of Classification Search ................ 341/13, 341/137, 155, 120, 159; 250/225
See application file for complete search history.

(56) References Cited

U.S. PATENT DOCUMENTS

| | | | |
|---|---|---|---|
| 4,946,264 | A | 8/1990 | Davis |
| 5,010,346 | A | 4/1991 | Hamilton et al. |
| 5,039,988 | A | 8/1991 | Hong |
| 5,428,697 | A | 6/1995 | Dolfi et al. |
| 5,545,468 | A | 8/1996 | Koshiba et al. |
| 6,100,831 | A | 8/2000 | Frankel |
| 6,118,397 | A | 9/2000 | Heflinger |
| 6,188,342 | B1 | 9/2000 | Gallo |
| 6,219,172 | B1 | 4/2001 | Yariv |
| 6,246,350 | B1 | 6/2001 | Yap |
| 6,372,384 | B1 | 4/2002 | Fujimoto et al. |

(Continued)

FOREIGN PATENT DOCUMENTS

EP 1014588 6/2000

OTHER PUBLICATIONS

Marc Currie, Thomas R. Clark, and Paul J. Matthews, "Photonic Analog-to-Digital Conversion by Distributed Phase Modulation", *IEEE Photonics Technology Letters*, vol. 12, No. 12, Dec. 2000, pp. 1689-1691.

(Continued)

*Primary Examiner*—Jean Bruner Jeanglaude
(74) *Attorney, Agent, or Firm*—Greer, Burns & Crain, Ltd.

(57) ABSTRACT

A microwave frequency deflection cell analog to digital converter is provided. The phase velocity of an optical wave is effectively reduced to that of a microwave frequency electro-magnetic signal in an optical deflector. The electro-optic effect is used for a controlled deflection of an optical beam. The angle of beam deflection varies in accordance with an applied voltage, which may be a signal in the microwave frequency range. A device of the invention includes a birefringent crystal having transmission line conductors arranged to create an electric field in the crystal in response to an applied voltage, and mirrors arranged to create a multi-bounce path through the crystal for a light beam directed into the crystal on an entrance path that is non parallel to the mirrors. The multi-bounce path effectively slows the velocity of the optical wave to that of the voltage wave, permitting deflection or modulation of the beam by microwave frequency electrical signals.

21 Claims, 11 Drawing Sheets

U.S. PATENT DOCUMENTS

| | | |
|---|---|---|
| 6,525,682 B2 | 2/2003 | Yap |
| 6,714,149 B2 | 3/2004 | Nannally et al. |

OTHER PUBLICATIONS

Warren Marwood, A. Peter Willis, Petar B. Atanackovic, Ken J. Grant and Ian G. Fuss, "A Wide-Band, High Precision Optoelectronic Analog-to-Digital Converter", *Proceedings of International Conference on Signal Processing Applications and Technology*, http://www.icspat.com/papers/230mfi.pdf, pp. 486-490, no date.

Thomas R. Clark Jr., "High-Performance Photonic Analog-to-Digital Converters", pp. WV1-1-WV1-3, Technical Digest, Mar. 21, 2001, *Optical Fiber Communication Conference and Exhibit*, Mar. 17-22, 2001, Anaheim Convention Center, Anaheim, California.

T. Saida, K. Okamoto, H. Yamada, K. Takiguchi, T. Shibata, A. Sugita, and K. Uchiyama, "Optical pulse pattern recognition circuit based on an optical digital-to-analog converter on a Planar Lightwave Circuit", pp. WY2-1-WY2-3, Technical Digest, Mar. 21, 2001, *Optical Fiber Communication Center and Exhibit*, Mar. 17-22, 2001, Anaheim Convention Center, Anaheim, California.

W.A. Scanga, "Traveling-Wave Light Modulator", *Applied Optics*, vol. 4., No. 9, Sep. 1965, pp. 1103-1106.

Q. Chen et al., "Guided-Wave Electro-Optic Beam Deflector Using Domain Reversal in $LiTaO_3$", *Journal of Lightwave Technology*, vol. 12, No. 8, Aug. 1994, pp. 1401-1404.

D. A. Scrymgeour et al., "Large-Angle Electro-Optic Laser Scanner on $LiTaO_3$ Fabricated by in situ Monitoring of Ferroelectric-Domain Micropatterning", *Applied Optics*, vol. 40, No. 34, Dec. 1, 2001, pp. 6236-6241.

D.A. Scrymgeour et al., "Cascaded Electro-Optic Scanning of Laser Light Over Large Angles Using Domain Microengineered Ferroelectrics", *Applied Physics Letters*, vol. 81, No. 17, Oct. 21, 2002, pp. 3140-3142.

Y. Chiu et al., "Design and Simulation of Waveguide Electrooptic Beam Deflectors", *Journal of Lightwave Technology*, vol. 13, No. 10, Oct. 1995, pp. 2049-2052.

I.P. Kaminow et al., "A 964-GHz Traveling-Wave Electro-Optic Light Modulator", *Applied Physics Letters*, vol. 16, No. 11, Jun. 1, 1970, pp. 416-418.

D.C. Auth, "Half-Octave Bandwidth Traveling-Wave X-Band Optical Phase Modulator", *IEEE Journal of Quantum Electronics*, Dec. 1969, pp. 622-623.

M. DiDomenico, Jr. et al., "Broadband Electro-Optic Traveling-Wave Light Modulators", *The Bell System Technical Journal*, Nov. 1963, pp. 2621-2678.

W.W. Rigrod et al. "Wide-Band Microwave Light Modulation", *Proceedings of the IEEE*, Jan. 1963, pp. 137-140.

P. Saunier, C.S. Tsai, I.W. Yao, and Le T. Nguyen, "Electrooptic Phased-Array Light Beam Deflector With Application to Analog-to Digital Conversion," 1978 Topical Meeting on Integrated and Guided-Wave Optics, Tech. Digest, pp. TuC2-1 to TuC2-4, OSA 78CH1280-7QEA, month unknown.

T.G. Giallorenzi, "An Overview of Micro-Optic Signal Processing Research," 1978 Topical Meeting on Integrated and Guided-Wave Optics, Tech. Digest, pp. MA-1 to MA-3, OSA 78CH1280-7QEA, month unknown.

Y. Tsunoda et al., "Combined Optical AD Conversion and Page Composition for Holographic Memory Applications", *Applied Optics*, vol. 16, No. 10, Oct. 1977, pp. 2607-2609.

C.S. Tsai et al., "Wideband Integrated Optic Signal Processors", *SPIE*, vol. 154, 1978, pp. 60-63, no month.

_US 7,233,261 B2_

MICROWAVE FREQUENCY ELECTRO-OPTICAL BEAM DEFLECTOR AND ANALOG TO DIGITAL CONVERSION

STATEMENT OF GOVERNMENT INTEREST

This invention was made with Government assistance under United States Space and Missile Command contract number DASG60-02-G-0015. The Government has certain rights in this invention.

FIELD OF THE INVENTION

A field of the invention is electro-optics. Another field of the invention is signal conversion, and particularly the digitization of analog signals. Another field of invention is optical beam deflection.

BACKGROUND

Many electro-optical devices rely upon the controlled deflection of a light beam. The electrical control of optical beam deflection finds use in optical signal processing, displays, printing, scanning, optical drives, and other electro-optical devices.

The use of electro-optical deflection of a light beam has been recently extended to signal conversion. Nunnally et al, U.S. Pat. No. 6,714,149, discloses an analog signal conversion technique that is based upon the optical deflection of a light beam. In the invention of the '149 patent, an analog signal is converted to an optical deflection. Embodiments disclosed in the '149 patent include an N-bit parallel output. Embodiments disclosed in the '149 patent include a light beam deflected according to an analog signal being converted with a spatial filter into an N-bit binary light pattern that is then collected and sensed by optical detectors.

The invention of the '149 patent provided a new technique for the conversion of analog signals into digital signals, which is a fundamental task necessary in uncountable varieties of electronic devices. Conventional analog to digital converters (ADCs) had employed electronic circuitry and repetitive processing to define the digital value of an analog signal. Higher frequency signals require higher sampling rates, i.e., the rate at which an analog signal is measured for the purpose of determining a corresponding digital value. One guideline is known as the Nyquist criteria. The Nyquist criteria requires that the digital sampling rate be greater than two times the analog frequency in order to faithfully reproduce the analog signal from the digital values. In practice of the prior conventional devices, the sampling rate was typically chosen to be 5 times the analog frequency to be sampled. As frequencies of interest become high, e.g., in the tens of GigaHertz, conventional electronic techniques may not meet a desired rate of sampling. Even at lower frequencies, the electronics for a high quality analog to digital conversion may become complex and expensive. These problems were addressed by the invention of the '149 patent.

A limitation arises when analog signals venture into the microwave frequency range. Deflection may be achieved, as in preferred embodiments of the '149 patent, by passing a light beam through a birefringent crystal and deflecting the light beam by applying an electrical field to the crystal. The analog signal may be used to create the electric field and provide the basis for a deflection that can be converted into a digital value. At microwave frequency, however, the phase velocity of the microwave electric field and the optical electric field must be matched in an electro-optical crystal. At frequencies lower than microwave, the electric field may be considered constant during the passage of the optical wave through the crystal, but that does not hold true at microwave frequencies.

Electro-optical modulation has been achieved with microwave excitation through techniques that increase the speed of the electromagnetic voltage wave in a waveguide to match the phase velocity of the optical wave and the voltage wave. Waveguide phase matching is maintained over a relatively narrow frequency band due to the frequency dependence of the waveguide. Examples of these phase velocity matching techniques based upon increasing the phase velocity of the electro-magnetic wave in a waveguide are disclosed in the following publications: "Performance and Modeling of Broadband LiNBO$_3$ Traveling waver Optical Intensity Modulator," G. K. Golpalakrishnan et al, Journal of Lightwave Technology, Vol. 12, No. 10, October 1994; Ti:LiNBO$_3$ Millimeter-Wave Optical Modulators," K. Noguchi et al., Vol. 16, No. 4, April 1998.

SUMMARY OF THE INVENTION

In embodiments of the invention, the effective phase velocity of the optical sampling wave is reduced to match to that of a microwave frequency electromagnetic signal being sampled. The electric field of the microwave frequency wave, traveling in a transverse electromagnetic (TEM) transmission line, interacting synchronously with the optical wave in an electro-optical crystal to form an optical deflector. The electro-optic effect is used for a controlled deflection of an optical beam. The angle of beam deflection varies in accordance with an applied voltage, which may be a signal in the microwave frequency range. A device of the invention includes a birefringent crystal having transmission line conductors arranged to create an electric field in the crystal in response to an applied voltage (microwave signal), and mirrors arranged to create a multi-bounce path through the crystal for a light beam directed into the crystal. The multi-bounce path effectively slows the velocity of the optical wave to that of the voltage wave (microwave signal), permitting controlled deflection of the beam by the microwave frequency electrical signal. Devices of the invention may also deflect an optical beam in accordance with lower frequency signals.

A specific embodiment uses a microwave frequency deflection cell of the invention to conduct analog to digital conversion of analog signals ranging into the microwave frequency range. An analog signal is converted to an optical deflection by the microwave frequency deflection cell. In preferred embodiments, an N-bit parallel output is obtained. A particularly preferred embodiment patterns the light beam with a spatial filter into an N-bit binary light pattern that is then collected and sensed by optical detectors.

BEST MODE OF CARRYING OUT THE INVENTION

In a preferred embodiment, the deflection of an optical beam is used to encode a digital signal, and a multi-bounce path for the optical beam slows its phase velocity. An analog signal to be encoded is applied to an optical deflector. A light beam is passed through an optical deflector along a multi-bounce path. Encoding is realized with a digital value that depends upon the angular deflection of the light beam. A pulsed light beam may be used in preferred embodiments. The multi-bounce path permits high frequency analog signals (GHz) to be converted. Theory of operation suggests that the optical detectors used to detect the deflected optical beam will be the only limit on detection. In practice, optical pulse frequency, width of optical pulses, and the speed of deflection will limit the rate of conversion until the several to ten picosecond pulse rate of optical detectors is equaled or exceeded.

Figure 1:
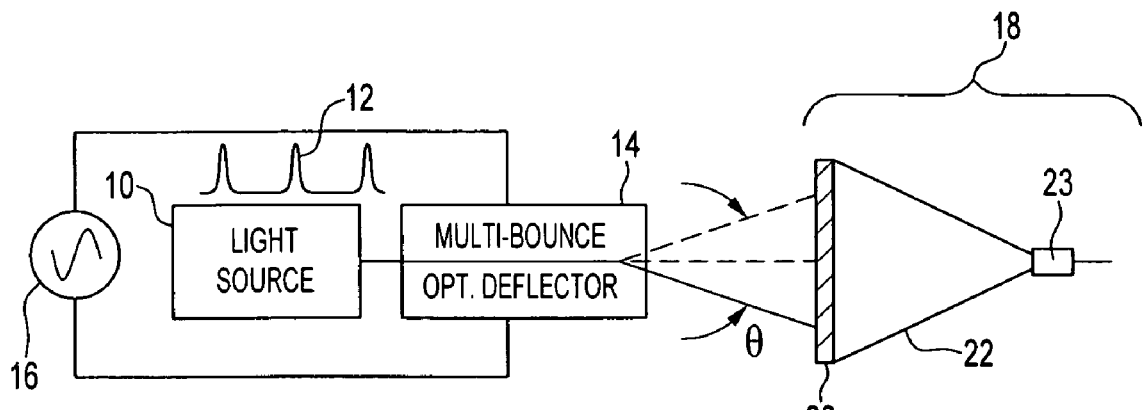
FIG. 1 is a block diagram of a preferred embodiment electro-optical analog to digital converter.

Referring now to FIG. 1, a schematic view of a preferred embodiment optical probe analog to digital converter is shown. The preferred converter includes a light source 10 that emits a light beam 12. An optical multi-bounce deflector 14 accepts and deflects the output of the light beam 12 in angular variations that depend upon a magnitude of an analog signal 16 to be converted. The range of deflection encompasses $2^N$ angular variations corresponding to an analog to N-bit digital conversion. The deflection itself in the preferred embodiment is analog, but encompasses the discrete angular variations. A discrete incremental deflection by the optical multi-bounce deflector 14, i.e., digital deflection in $2^N$ discrete angles of deflection would also work. As used herein, the phrase range of deflection encompasses a continuous and discrete deflection by the optical multi-bounce deflector 14. An optical detection system 18 translates the deflection encompassing $2^N$ angular variations into a N bit parallel output encoding $2^N$ digital bits.

The light source 10 is preferably a pulsed laser. The repetition frequency of the pulse laser light source 10 can set the conversion rate of the converter. In the preferred embodiment, the optical detection system 18 includes a spatial filter 20 that patterns the light beam 12. The purpose of the spatial filter 20 is to pattern the light into a binary bit pattern.

Figure 2:
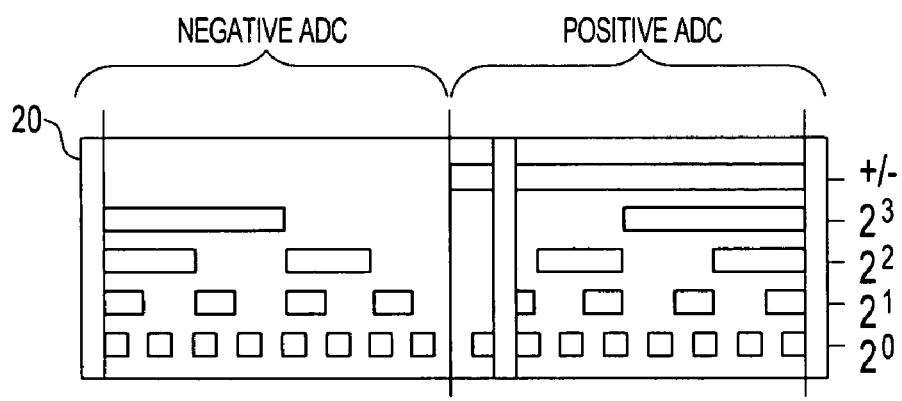
FIG. 2 illustrates a preferred spatial filter.

The spatial filter, an example of which is shown in FIG. 2, includes $2^N$ binary bit patterns arranged in columns including a zero deflection pattern and $2^{N-1}$ positive value deflection patterns that mimic N-bit digital "1" and "0" patterns preferably arranged from the least significant bit to the most significant bit. A straightforward implementation passes light from the light beam 12 corresponding to "1" bits and blocks light corresponding to "0" bits. Each column includes N rows to realize a parallel encoding of N bits. In the preferred embodiment, an N+1 row serves as positive/negative indication bit, and an additional set of $2^{N-1}$ negative value deflection patterns in the spatial filter 20 encode negative bits. An optical collection system 22 collects light passing the spatial filter 20 and directs it to a N+1 bit array of photo-conductors 23 that convert the collected optical energy pulses to N-bit digital electrical pulses (and includes the N+1 extra detector for a positive/negative indication bit).

In the preferred embodiment, there is a linear relationship between the angle of deflection and the bit being encoded. The angular deflection of the probe optical pulse light beam 12 for zero voltage is also zero and corresponds to the center of the spatial filter. A positive voltage results in a deflection in one direction that increases in a linear fashion in proportion to the analog signal 16. A negative voltage results in a deflection in the other direction that increases in a linear fashion in proportion to the analog signal 16. The total range of light beam deflection is indicated in FIG. 1 by the angle θ. Other relationships between the angle of deflection and the bit being encoded that produce an N-bit parallel output having a unique value for the range of $2^N$ angular variations are also permissible.

Figure 3:
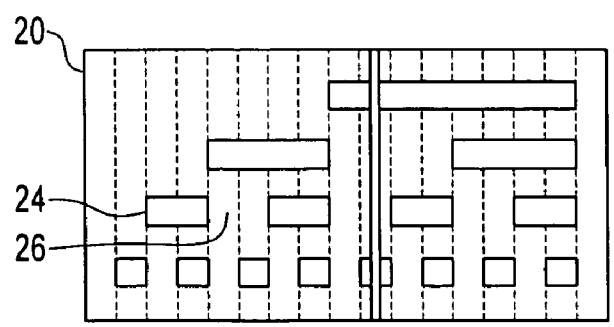
FIG. 3 illustrates the binary bit pattern spatial function implemented by the spatial filter of FIG. 2.

The FIG. 2 preferred implementation of the spatial filter 20 is graphically represented for explanatory purposes in FIG. 3. Negative bits and the additional bit for positive/negative encoding are not shown in FIG. 3. The negative bits of FIG. 2 are the mirror image of the positive bit encoding for the binary bit pattern spatial function shown in FIG. 3. The spatial filter includes apertures 24 arranged in N rows and $2^N$ columns that encode "1" bits by passing the light beam, which spans the N+1 rows. Masks 26 encode "0" bits. Specifically, each of the columns encodes an N bit digital value with the rows coding bits from a least significant bit to a most significant bit. FIGS. 2 and 3 represent a 4 bit conversion, but the binary patterns encoded are easily extended to many more bits. The only limits on the number of bits that may be encoded are the range and speed for the optical deflection. The resolution of the spatial filter has no affect on the speed of the converter, permitting increases in the resolution conversion independent of the speed of conversion.

While the FIG. 1 embodiment directs light passing the spatial filter 20 to the optical collection system 22 with an N+1 array of detectors 23, the filter also would permit optical energy to pass through the apertures 24 directly onto an array of optical detectors or optical fibers. Another alternative omits the spatial filter completely. In this alternative, an array of detectors has the graphical pattern shown in FIGS. 2 and 3. The apertures are replaced with active detectors, and the masks have no detectors, inactive detectors, or detectors controlled to be inactive.

In FIG. 3, a top row of apertures 24 represents the most significant bit and arranges 8 of the aperture areas together and 8 of the mask areas together. If the analog signal creates a deflection that is greater than 8 columns of the FIG. 3 pattern, the $2^3$ bit output is equal to 1. Similarly, the second row represents the $2^2$ bit, and for the example shown in FIG. 3, zero optical energy will be transmitted through the filter resulting in a zero optical output for this bit. The third row represents the $2^1$ bit which also equals zero in FIG. 3 example. The bottom row represents the $2^0$ bit and optical energy will be transmitted such that the least significant bit will equal "1" for the example of FIG. 3. Thus, the digital word that represents the analog voltage illustrated in FIG. 3 is 1001.

Figure 4A:
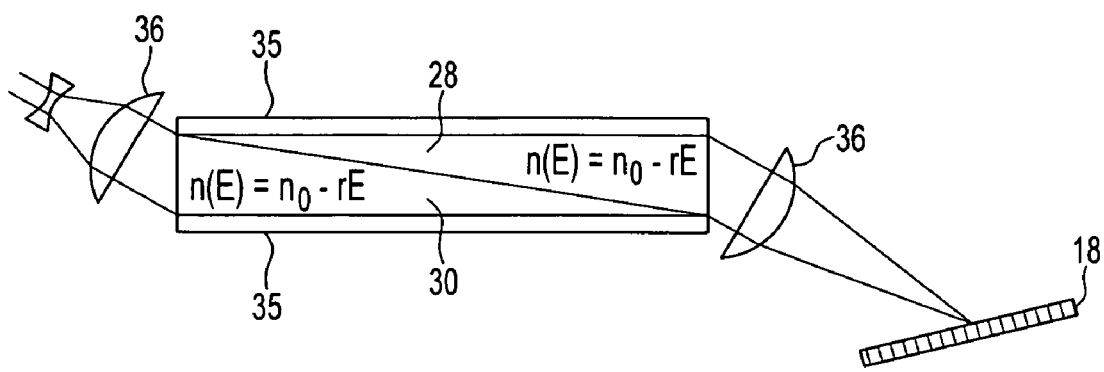
FIGS. 4A and 4B illustrate a preferred optical voltage to wavelength converter.
Figure 4B:
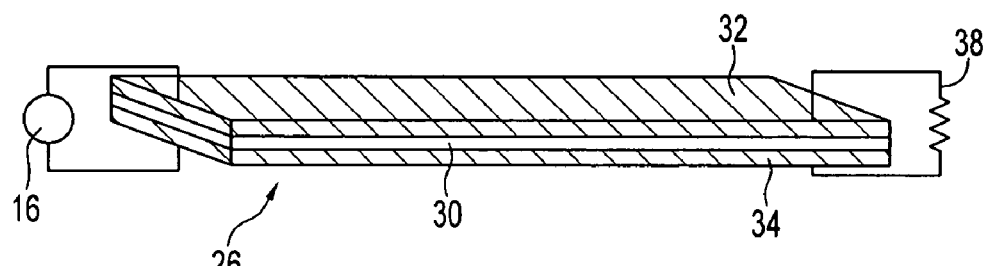

A voltage to optical wave deflection system can be embodied in a number of ways. A preferred multi-bounce deflector system uses the electro-optical effect to affect a change in the index of refraction of a birefringent crystal. This is shown in FIGS. 4A and 4B. In FIGS. 4A and 4B, the analog signal 16 is applied to an electro optical interaction cell 26. The interaction cell 26 is a transmission line dielectric fabricated of two bi-refringent crystals 28, 30 between transmission line conductors 32, 34. The two crystals exhibit single crystal behavior, but are cut and rotated to have opposite domain states. Thus there is an interface where the crystals are joined. In other embodiments, described further below, alternate domain states are created in a crystal electrically. Reflective surfaces 35 are provided to induce the multi-bounce path. The sampling beam 12 is expanded to the width of the transmission line conductors 32, 34 by beam expansion optics 36 and enters the crystal at an angle to induce the multi-bounce path. The two bi-refringent crystals 28, 30 have opposite crystal orientations such that the index of refraction on one side of the transmission line is increased by a traveling wave electric field induced by a load 38 while the index of refraction on the other side of the transmission line is reduced. The index of refraction varies as a function of the electric field E, and the $r_{33}$ coefficient of the electro-optical tensor or $$n(E) = n_o \pm \frac{(n_o^3 r_{33} \cdot E)}{2}$$

where the sign of the second term is determined by the crystal orientation or ferroelectric domain orientation, and no is the extraordinary optical refractive index of the crystal. For example, the electro-optical coefficient for Lithium Niobate (LiNbO$_3$) is $r_{33}$=32×10$^{-12}$ m/V and for Strontium Barium Nitrate (Br$_x$Sr$_{1-x}$Nb$_2$O$_6$) is as large as $r_{33}$=1400×10$^{-12}$ m/V. SBN is another possibility. If the input digitizer input voltage is limited to 5V maximum, the thickness of the crystal and thus the height of the transmission line, $d_{TL}$, should be reduced to the minimum optically possible to obtain the desired deflection angle in the length, $L_{TL}$, of the transmission line interaction region. If the deflection angle is small, the deflection angle is approximated by $$\phi_d \approx \frac{n_o^3 \cdot r_{33} \cdot V \cdot L_{TL}}{w_{TL} \cdot d_{TL}}$$

where V is applied voltage $w_{TL}$ is the width of the transmission line, and $n_o$ is the nominal index of refraction of the crystal.

Another constraint on the transmission line is the impedance that is approximated by $$Z_{TL} = \sqrt{\frac{\mu_o}{\varepsilon_o}} \cdot \sqrt{\frac{1}{\varepsilon_c}} \cdot \frac{d_{TL}}{w_{TL}} = \sqrt{\frac{\mu_o}{\varepsilon_o}} \cdot \frac{1}{n_o} \cdot \frac{d_{TL}}{w_{TL}}$$

where $e_c$ is the relative permeability of the crystal and equal to the square root of the index of refraction, $n_o$.

Figure 4C:
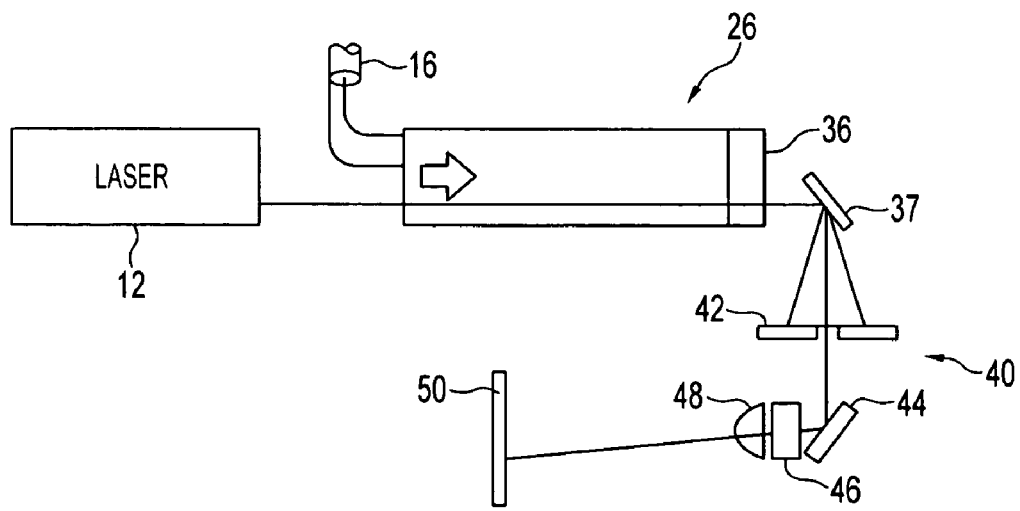
FIG. 4C illustrates an electro-optical analog to digital converter using the FIGS. 4A and 4B wavelength converter.

FIG. 4C shows an exemplary alternate optical ADC making use of the FIGS. 4A and 4B optical deflection. When an electric field is applied to the transmission line conductors 32, 34 the phase of the plane wave entering the transmission line is altered as it traverses the transmission line so that the phase of the output wavefront is focused through beam collection optics 36 onto a grating 38 at a different angle on the grating 38. The grating 38 output illuminates a slit that selects a specific wavelength band that is further projected on a spatial filter 40 having a beam slit 42, a second grating 44, a cylindrical expansion 46 and focusing optics 48.

Once the optical pulse has traversed the analog electric field along the transmission line, the optical deflection is related to the analog voltage. The optical deflection is then related to a specific wavelength band using two gratings 38 and 44. The change in direction of the beam 12 through the interaction cell 26 is translated into a specific incident angle at the grating 38. The narrow slit 42 is used to select a narrow wavelength band is then imaged on the grating 44 and expanded in one direction to form a line. It is then expanded by expansion optics 46, focused by focusing optics 48, and focused on a spatial detector 50, e.g., a CCD array.

Figure 4D:
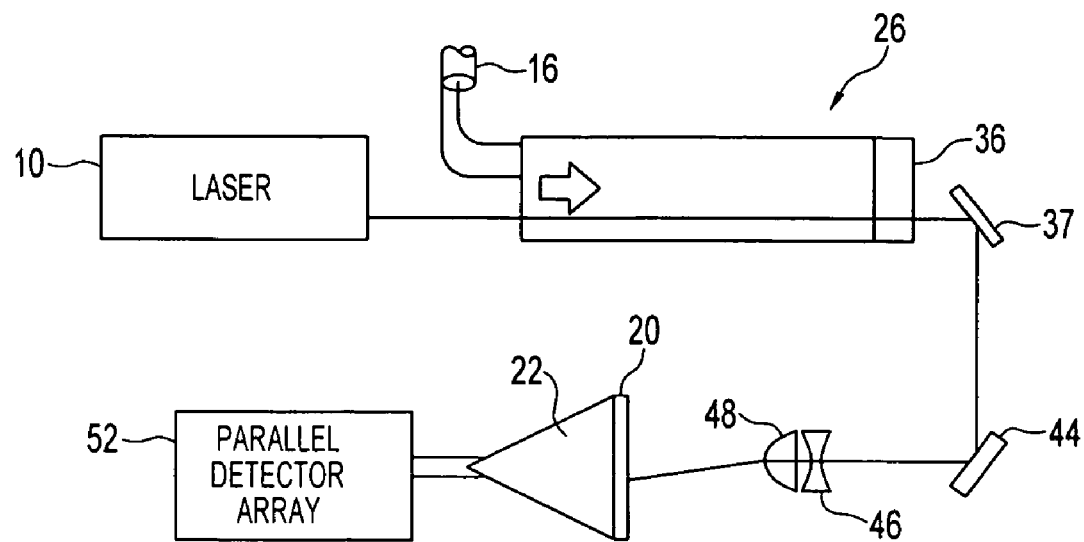
FIG. 4D illustrates an alternate electro-optical analog to digital converter using the FIG. 4A and FIG. 4B wavelength converter.

In a high sampling rate system, the CCD array of FIG. 4C must be replaced with a higher frequency optical detection system, an integrated optical waveguide collection system and traveling wave optical detectors to enable the electronics to keep up with the sampling rate. FIG. 4D shows such a high sampling rate system that uses the voltage to wavelength conversion and deflection of FIGS. 4A–4C with the optical collection and sensing of FIGS. 1–3. The CCD array is replaced with a high speed parallel detector array 52. The use of a spatial filter 20 with binary bit pattern of FIGS. 2–3 avoids the need for the slit 42 of FIG. 4C.

Figure 5:
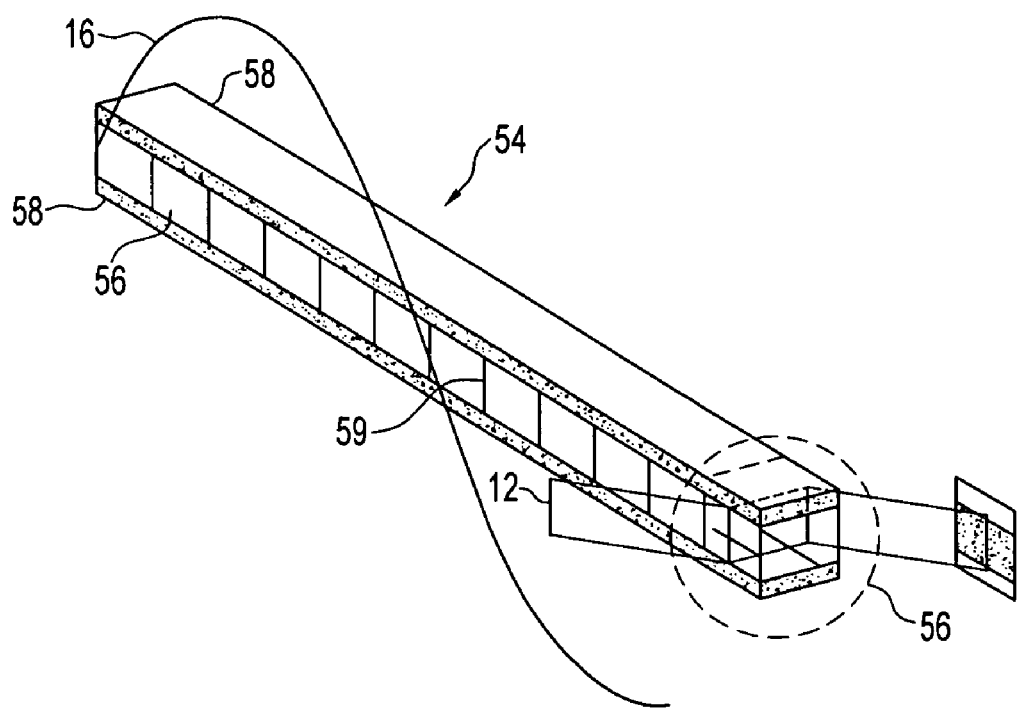
FIG. 5 illustrates a preferred electro-optical deflection cell geometry.

An alternate preferred optical multi-bounce deflector is illustrated in FIG. 5. In FIG. 5, a transmission line 54 carries the analog signal 16 to be sampled. A number of electro-optical deflection cells 56 make up the dielectric of the transmission line 54, formed between transmission line conductor 58. Reflective surfaces 59, e.g. dielectric mirrors, are between the cells 56. Optical pulses 12 enter at an angle and transmitted through each optical cell 56 are deflected in proportion to the voltage across the transmission line 54 at the point of beam crossing. The electro-optical deflection cell length along the transmission line 54 is selected such that the length of transmission line being sampled is equal to a small fraction of the highest wavelength to be sampled. A single wavelength of the highest frequency to be sampled is also illustrated in FIG. 4A. Note that an optical pulse can be applied to each of the cells 56 simultaneously or a high rate of optical pulses can be applied to a single cell 56 to sample the voltage wave as it traverses the transmission line. Each electro-optical deflection cell 56 is fabricated of two bi-refringent crystals with opposite crystal orientations such that the index of refraction on one side of interface is increased by the traveling wave electric field while the index of refraction on the other side of the interface is reduced, as in FIG. 4A. The resultant electro-optical deflection cell geometry is diagramed in FIG. 6 where the increased index is identified as n+ and the reduced index is identified as n−. With zero voltage applied to the cell, the deflection angle of the optical probe pulse is displayed on the center of the spatial filter shown in FIG. 2. The FIG. 2 filter includes apertures 24 (see FIG. 3) to encode 4 bits, both negative and positive, and an additional aperture 24 as an indication of a positive value. In FIG. 2, the right side of the filter determines the digital signal for a positive input voltage and the left side of the filter determines the digital signal for a negative input voltage. Optical energy from the probe pulse passes through the spatial filter where it is collected and transferred to detector array. Positive signals deflect the optical pulse probe to the right and negative signals to the left.

The transmission angle of the optical ray passing through a boundary is given by Snell's second law or $$\sin\Theta_T = \frac{n_I}{n_T} \cdot \sin\Theta_I$$

where $\theta_1$ is the incident angle and $\theta_T$ is the transmitted angle, $n_I$ is the index of the incident ray and $n_T$ is the index of the transmitted ray. Without a voltage applied to the cell, the transmitted angle is equal to the incident angle since the index for both sides is $n_O$. When voltage, V, is applied, the deflection angle is determined by the difference in indices or $$\sin\Theta_T = \sin\Theta_I \cdot \frac{(n_o + n_o^3(r_{33}V))/(2d)}{(n_o - n_o^3(r_{33}V))/(2d)}$$
$$= \sin\Theta_I \cdot \left[1 + \frac{(1 + n_o^2(r_{33}V))/(2d)}{(1 - n_o^2(r_{33}V))/(2d)}\right]$$
$$\cong \sin\Theta_I \cdot \left(1 + \frac{(1 + n_o^2(r_{33}V))}{d}\right)$$

Figure 6:
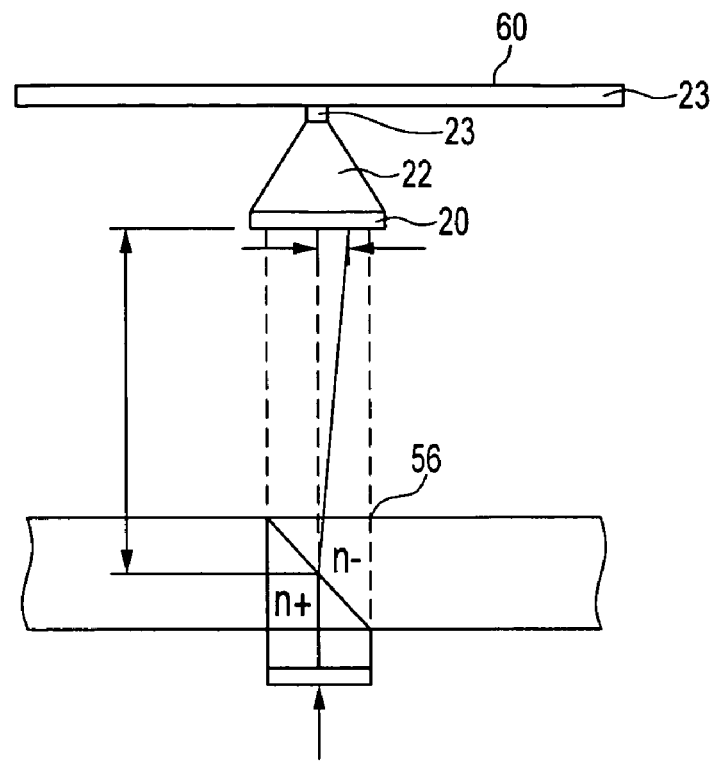
FIG. 6 illustrates a preferred electro-optical analog to digital converter using the FIG. 5 cell.
Figure 7:
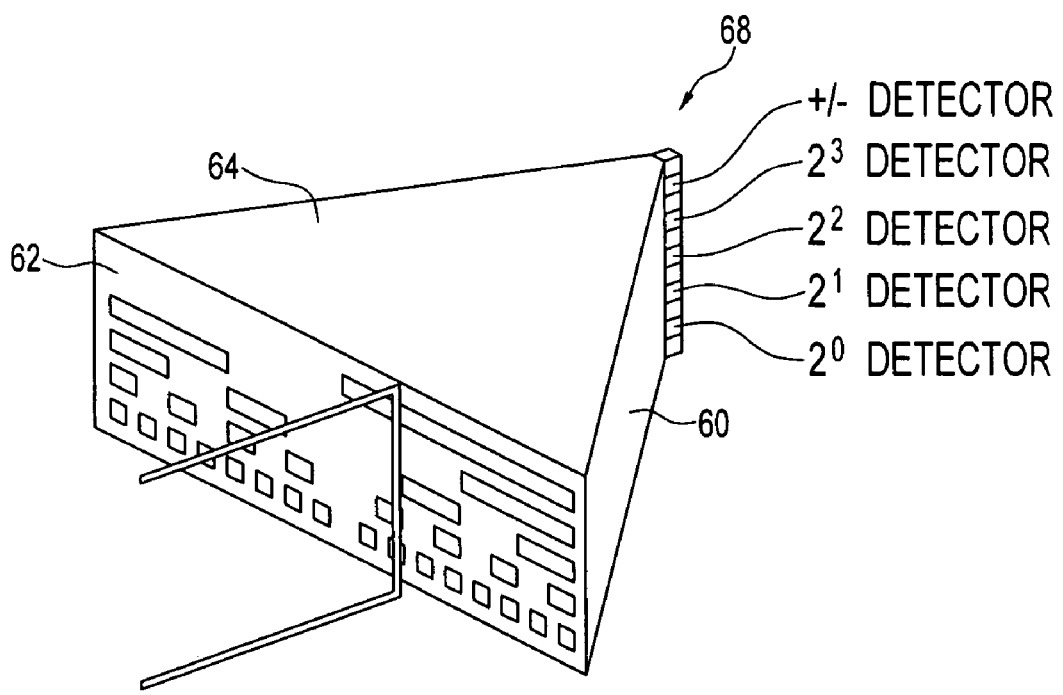
FIG. 7 illustrates a preferred embodiment optical collection system.

In FIG. 6, collection optics 22 pass the binary bit patterned beam to the optical detectors. Preferably, the optical detectors produce a parallel output that is transmitted to a data bus 60. A preferred optical collection system is illustrated in FIG. 7. As with other example, 4-bit encoding is used for convenience in illustrating the invention. Optical energy passing through a spatial filter 62 is collected using an optical collection system 64 formed from optical waveguides 60. The spatial filter 62 follows the binary bit pattern of FIGS. 2–3. The light passing the apertures retains its pattern and is directed toward an array 68 of N+1 photo-detectors. There are N detectors for encoding N-bit parallel data plus an additional detector for a positive/negative indication bit.

Figure 8:
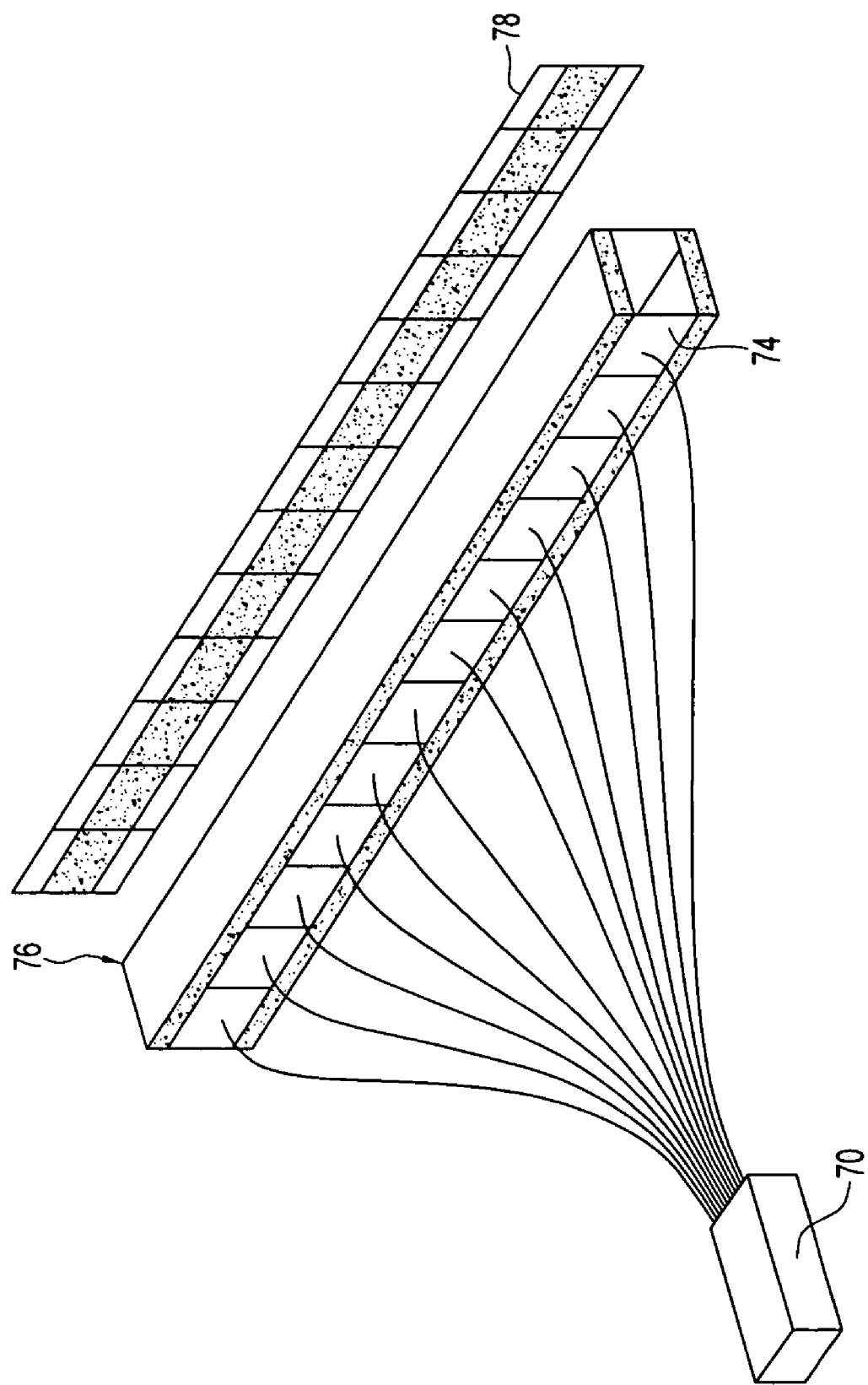
FIG. 8 illustrates a preferred parallel probing of a plurality of optical deflection cells.

There are several configurations for sampling the analog signal along the transmission line. Many electro-optical cells illustrated in FIG. 5 can be probed with optical signals in parallel as illustrated in FIG. 8. In FIG. 8, a laser probe source 70 emits parallel probe beams through optical fibers. Each fiber probes a separate electro-optical cell 74 formed in the transmission line multi-bounce deflector 76 according to FIG. 5. A spatial filter 78 imposing a binary bit pattern based upon deflection angle is associated with each electro-optical cell 74. Collection optics are not shown, but follow FIGS. 5–7. In this fashion, the optical pulse rate from the sampling optical source can be reduced due to the parallel nature of the sampling configuration. Another option is to use only one cell and a very high pulse rate laser to sample the wave as it moves along the transmission line.

The parallel sampling configuration of FIG. 8 requires a plurality of spatial filter components and electro-optical cells. However, these components can be fabricated using integrated optical techniques to reduce the cost as well as the physical size. The parallel configuration also reduces the pulse width requirements on the optical probe source. The sampling interval is the time required for the optical probe pulse to traverse the electro-optical deflection cell. The pulse rate required for the optical probe source is reduced to the sampling rate divided by the number of parallel optical paths. For example a 100 GHz sampling rate can be probed with an optical pulse rate of 10 GHz if ten electro-optical cells are used in the parallel configuration.

Figure 9:
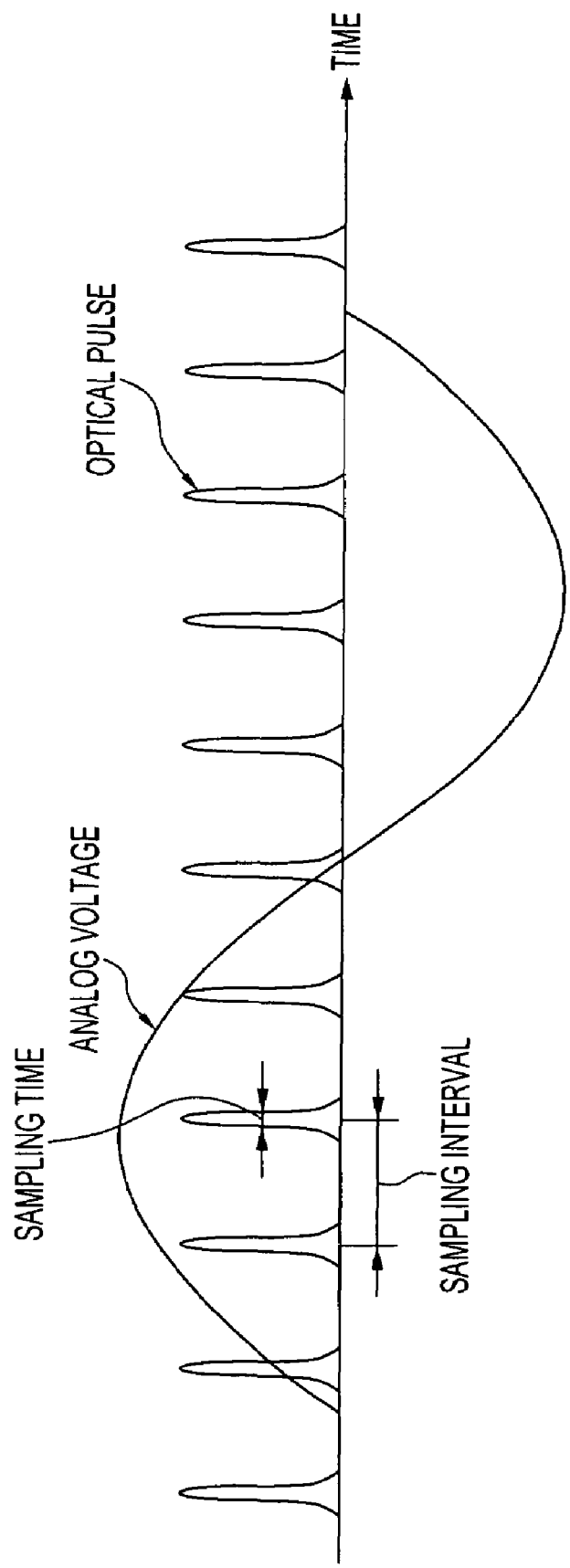
FIG. 9 illustrates a waveform for signal source sampling by a high pulse rate optical source with a optical pulse width less than the inter pulse spacing.

In order to implement a single site sampling system, a high-pulse rate optical source with an optical pulse width less than the inter pulse spacing is required as illustrated in FIG. 9. The optical probe pulse duration is equal to the desired sampling time and the optical pulse repetition rate is equal to the sampling rate, as illustrated in FIG. 9. For example, a pulse width of 1 pico-second or 1 ps and a pulse spacing of 10 ps will result in a ADC sampling rate of 100 GHz and an analog bandwidth of 20 GHz. An alternative high sampling rate system replaces the CCD array with a spatial optical filter, an integrated optical waveguide collection system and an array of high speed photodetectors, e.g., traveling wave optical detectors, to enable the detectors to respond to very short optical pulse duration.

In each of the embodiments, a multi-bounce deflection cell is used. Some preferred embodiment deflection cells will now be discussed. The deflection cells may be used in any of the preferred embodiment analog to digital converters discussed above. Preferred embodiment deflection cells can operate effectively at upper gigahertz rates.

Figure 10:
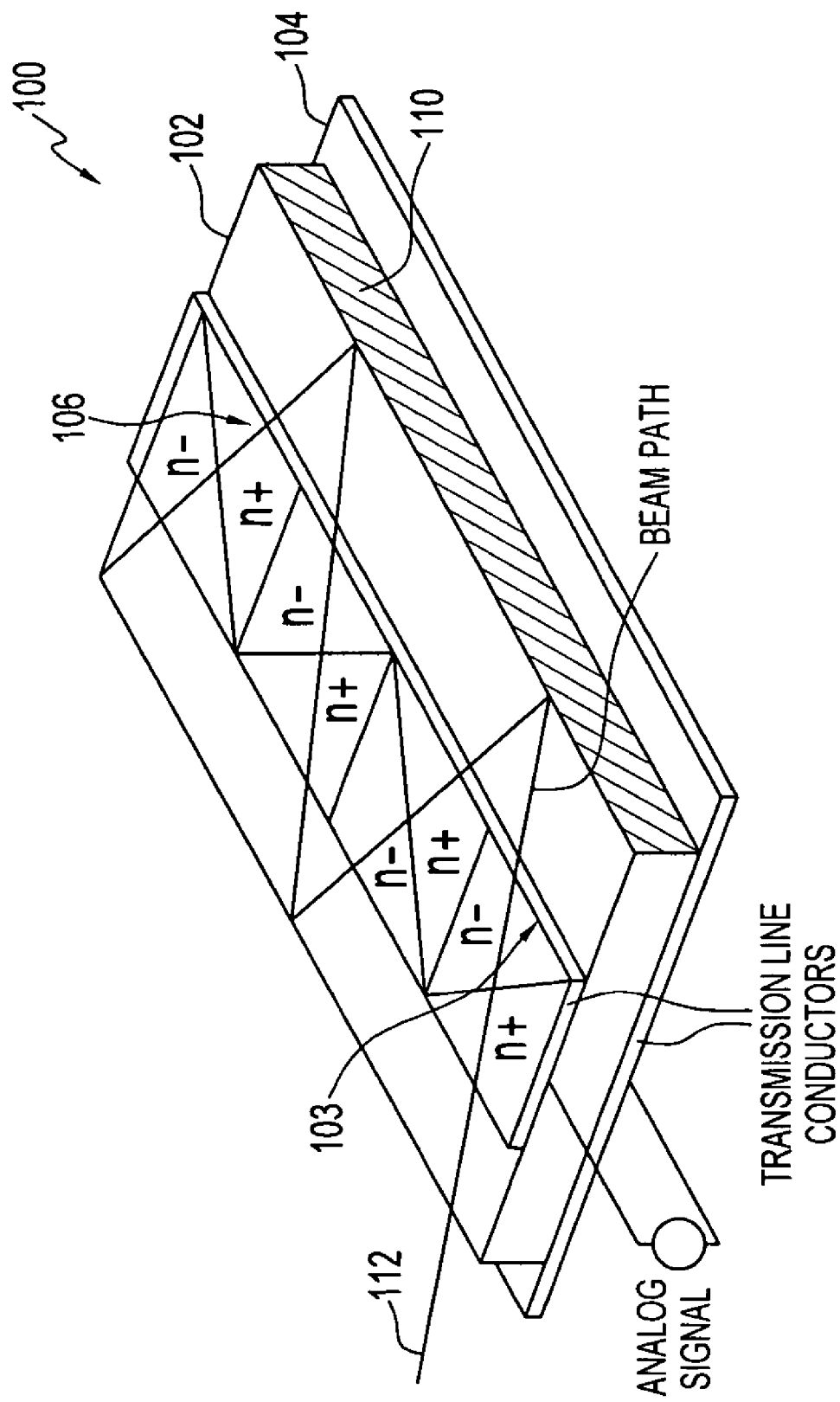
FIG. 10 is a perspective view of a preferred embodiment deflection cell.

A preferred embodiment deflection cell 100 is shown in FIG. 10. The deflection cell 100 includes a birefringent crystal 102 on a substrate 104. The crystal 102 includes a domain pattern 106 indicated by shaded n− regions and unshaded n+ regions, as seen through a top transmission line conductor 108 (which is shown as transparent in the perspective view to illustrate the domain pattern 106). A second transmission line conductor (unshown) is opposite the conductor 108 on the opposite bottom face of the crystal 102. The width of the transmission line conductors does not fully span the width of the crystal 102, which includes metal mirrors 110, one of which may be seen in the view of FIG. 10, on perpendicular faces of the crystal 102. The transmission line conductors 108 and the mirrors 100 are thereby separated from electrical contact, as the transmission line conductors 110 do not fully span the width of the crystal 102. A beam enters the crystal 102 at an angle, and crosses the domain pattern 106 a number of times due to a multi-bounce path 112 that is established by the reflection of the beam created by the mirrors 110. In deflection cell 100, the multi-bounce path 112 is created for the optical beam as it passes through the birefringent crystal 102, with transmission line conductors 108 permitting application of an electric field to the crystal 102.

Alternate embodiment cells may have different domain patterns. In addition, if the mirrors 110 are instead realized by dielectric mirrors, then the transmission line conductors 108 may span the full width of the crystal 102 because the transmission line conductors 108 will not be shorted by dielectric mirrors.

Metal mirrors are inexpensive and easy to fabricate. Dielectric mirrors are realized with multiple alternating thickness. The optimal thicknesses for layers depends on the angle of incidence of the optical beam into the deflection cell. Some physical principles will be discussed so that artisans may understand variations and optimizations of the preferred embodiment deflection cells to be discussed.

Quantities describing electromagnetic (EM) radiation include the frequency $f$ of field oscillations and free-space wavelength $\lambda_0$. The relationship between these is given in equation (1), where c is a constant equivalent to the speed of an EM wave in vacuum ($3 \cdot 10^8$ m/s).

$$c = \lambda_0 f \quad (1)$$

Optical waves have wavelengths ranging from 1 nanometer (nm=$10^{-9}$ meters) to 1 millimeter (mm=$10^{-3}$ meters) and are subdivided into the ultraviolet, visible, and infrared regions. Microwaves have frequencies from 1 GHz to 100 GHz. The EM wave most familiar to us is visible light, an optical wave with wavelength between 380 nm and 770 nm.

When EM radiation travels through a medium other than free space, it propagates more slowly than c. In this case, its velocity is given by equation (2), where v is known as the phase velocity of the wave, and n is the index of refraction or refractive index, which is a characteristic of the medium.

$$v = \frac{c}{n} \quad (2)$$

The refractive index, n, is 1 for the vacuum condition and essentially the same for air. Almost all other media have refractive indices greater than 1. Physically n is a measure of how easily an EM wave can displace the electrons of its propagation medium with its own electric field oscillations.

For an EM wave traveling in a medium of refractive index n, a relationship analogous to equation (1) can be obtained by dividing equation (1) through by n. The result is given as equation (3). We note that this EM wave has a shorter wavelength, $\lambda_{med}$, in matter than it has when traveling in free space.

$$v = \left(\frac{\lambda_0}{n}\right) f = \lambda_{med} f \quad (3)$$

Note that the index of refraction n of a medium varies with wavelength. For this reason one must specify the wavelength when declaring the refractive index.

When any EM wave, such as light, travels through a crystal, the phase velocity is dependent on the polarization of the wave. This is because the direction of electric field vector oscillations dictates which of the refractive indices ($n_1$, $n_2$, or $n_3$) will govern propagation of the wave as long as the displacement vector is parallel to the electric field vector, which is true when propagation follows a principal axis.

Ferroelectric crystals, such as $LiTaO_3$ and $LiNbO_3$, by definition have a permanent electric dipole moment that can be reoriented by the application of an electric field. If intended for use in electro-optics, these crystals must undergo poling when they are manufactured. That is, an electric field larger than the coercive field is applied while the crystal is cooled from melt temperature. A coercive field is needed to align all molecular dipole moments in a single direction. A ferroelectric crystal must be properly poled if it is to exhibit the EO effect.

A ferroelectric domain is a region in the crystal where all the dipole moments point in the same direction. If poled as described above, the crystal is termed single domain state and exhibits only one ferroelectric domain. After a crystal is poled single domain, a domain reversal process may be performed over desired areas of the crystal. During domain reversal, a coercive field is applied in the direction opposite to that at which the coercive field was applied during poling. We call the two oppositely-poled domains $n_+$ and $n_-$ because if an identical electric field is applied over both domains, one will experience an increase in refractive index and the other an identical decrease.

Single-crystal behavior is required for the deflection cells. No crystal boundaries can exist within the crystal and the atomic structural arrangement is uniform.

Two special cases are worth noting when light hits an interface between two different media. If the incident light encounters the interface of the two media perpendicularly, it passes straight through without deflection. Also, when light is passing from a higher index to a lower index a critical angle $\theta_c$ exists. If the angle of incidence is greater than this angle, no light is transmitted, and total internal reflection (TIR) occurs.

$$\theta_c \sin^{-1}\frac{n_2}{n_1} \quad n_1 > n_2 \quad (4)$$

The portion of the EM wave that is reflected at the boundary of the two media follows a path given by $\theta_r = \theta_i$. This law states that the angle of reflection is equal to the angle of incidence.

When light begins in a higher index material and bounces off a lower index material, it is called an internal reflection. When light begins in a lower index material and bounces off a higher index material, it is called an external reflection.

A laser can be made to operate in a single fundamental mode, and it will be assumed for simplicity of illustration in the preferred embodiments that the laser producing the beam to be deflected operates in a single mode, or that higher order modes may be neglected.

In the deflection cells, the electric field of the microwave causes an index difference between alternating domain areas in the birefringent crystal. Deflection is applied to the beam by the transmission line, which may receive a high frequency analog signal to be converted. The lateral width (in space) of the optical pulse should be much smaller than the wavelength of the highest frequency analog signal to be digitized. In this way, the optical pulse will not see a traveling phase diffraction grating When an EO crystal is placed between parallel-plate conductors to form a transmission line, a TEM mode can propagate with a phase velocity given by $$\frac{c}{\sqrt{\varepsilon_r}}$$

where $\varepsilon_r$ is the dielectric constant of the crystal. A light beam can also propagate through the same crystal at a velocity given by the same expression. The dielectric constant $\varepsilon_r$ of most EO crystals, however, is much different at microwave frequencies than it is at optical frequencies. As a result, the optical energy often propagates through the crystal much faster than the microwave. Velocity matching be performed through proper beam angling and multiple reflections. Equation (5) can be used to calculate the velocity-matching angle that will reduce the effective optical phase velocity to match that of the microwave.

$$\theta = \sin^{-1}\left(\frac{n_{OP}}{n_{MW}}\right) = \sin^{-1}\left(\frac{n}{\sqrt{\varepsilon_r}}\right) \quad (5)$$

Here $n_{OP}$ and $n_{MW}$ refer to the refractive indices of the crystal at optical and microwave frequencies respectively. From here on, n will refer to the refractive index of the crystal at the appropriate optical frequency, and $n_{MW}$ will be replaced with $$\sqrt{\varepsilon_r}$$

where $\varepsilon_r$ refers to the dielectric constant of the crystal at the appropriate microwave frequency.

Different types of birefringent crystals may be used. The most useful crystal symmetry classes are uniaxial under an applied field, as this will allow the use of TE or TM-polarized light beams. When the electric field is applied along z, these conditions require that $r_{13}=r_{23}\neq 0$, $r_{33}\neq 0$, and $r_{43}=r_{53}=r_{63}=0$. Crystals belonging to classes 4, 4 mm, 3, 3m, 6, and 6 mm satisfy these conditions. Crystals in classes mm2 and $\bar{6}$m2 are biaxial under the applied field but are still useful in a deflector cell if the light beam is TE polarized. For class $\bar{6}$m2 the field must be applied along y.

LiNbO$_3$ and LiTaO$_3$ make excellent deflector materials. This is due largely to the high coercive field of the crystals. For this application, the single-crystal, congruently grown type of these crystals is preferred over the stoichiometric version of the crystals, which displays a much lower coercive field. LiNbO$_3$ and LiTaO$_3$ are also preferred because they can be cut, polished, and handled roughly without the creation of additional domains.

The general formula for calculating the reflective layer thicknesses in a dielectric mirror is simple. Each layer is to have a thickness of one quarter wavelength of the light in the material ($\lambda/(4n)$). This formula, however, only applies when the light beam is at normal incidence to the mirror. For the case of an incidence angle greater than zero, the situation is different. The optimum layer thicknesses are:

$$t_H = \frac{\lambda}{4\cdot\sqrt{n_H^2 - n_0^2\sin^2\theta_i}} \quad (6)$$

$$t_L = \frac{\lambda}{4\cdot\sqrt{n_L^2 - n_0^2\sin^2\theta_i}} \quad (7)$$

Note that when $\theta_i=0$ the layer thicknesses simplify to one quarter of the material wavelength, as expected. It is implicitly assumed that $n_0<n_H$ and $n_H>n_L$. These formulas are valid for TE polarized light if $$\theta_i < \sin^{-1}\left(\frac{n_L}{n_0}\right).$$

The same formulas are valid for TM polarized light if $$\theta_i < \sin^{-1}\left[\frac{1}{n_0}\left(\frac{1}{n_L^2} + \frac{1}{n_H^2}\right)^{\frac{1}{2}}\right].$$

The number of dielectric mirror layers necessary depends on how much optical energy can be afforded to mirror losses. If the mirror is to produce multiple reflections, then the energy remaining in the beam after n reflections is R$^n$. If R=95% then 77.4% of the original energy remains in the beam after 5 reflections. If R=99% then 95.1% of the energy remains in the beam after 5 reflections and 90.4% after 10 reflections.

A metal mirror can be constructed simply by vacuum depositing a thin metal film onto a substrate. The type of metal for an optimal design is wavelength dependent. For an example, a HeNe laser of wavelength 633 nm, silver mirror coatings will produce the highest reflectance. The reflectance is about 95% for TE polarization and 94% for TM polarization. Other metals, e.g., platinum, palladium may also be used. Adequate reflection and compatibility for deposit on the crystal surface are the basic requirements. Metals may be selected also based upon their compatibility with the crystal used in the deflector. Some metals, e.g., gold, may not adhere well. Also, thin metal films are delicate, and a thin dielectric layer may be used to protect the outer surface of the mirror, and should not have an effect on the performance of the mirror.

FIGS. 11A–11F illustrate preferred deflection cells. A crystal 120, for example is a LiTaO$_3$ wafer that is z-cut, so that the optic axis (z-axis) of the crystal is perpendicular to the cut. Electrodes are applied to the +z and −z faces of the wafer to form a parallel-plate transmission line for the analog signal. The electrodes are unseen in FIGS. 11A–11F because the view is through the electrodes' face in FIGS. 11A–11F.

The crystal 120 includes patterned ferroelectric domain areas 122a and 122b. In the domain area 122a the spontaneous polarization direction of the material is in the +z direction, while in domain area 122b the spontaneous polarization direction has been reversed so that it is opposite to the +z direction. In the n+ domain area 122a, the extraordinary refractive index change is given by $$\Delta n = +\frac{1}{2}n_e^3 r_{33} E_z,$$

and in the domain area 122b the extraordinary refractive index change is given by $$\Delta n = -\frac{1}{2}n_e^3 r_{33} E_z.$$

Light passing through the domain boundaries between 122a and 122b undergoes refraction when a field $E_z$ is present.

FIGS. 11A–11F show several domain patterns which will produce cumulative deflection. The path 124 indicates the undeflected beam path. θ is the velocity-matching angle. The crystal 120 is poled through its entire thickness. The multi-bounce path 124 results from the angle θ and mirrors 126. The path 124 crosses diagonal interfaces 128 (boundary between n+ and n− regions 122a, 122b) and horizontal interfaces 130, but not vertical interfaces 132.

In FIGS. 11A, 11B, 11D, 11E and 11F, all refractions contribute to the cumulative deflection of the beam. In FIG. 11C, however, the third refraction works against one, two, and four.

Figure 11A:
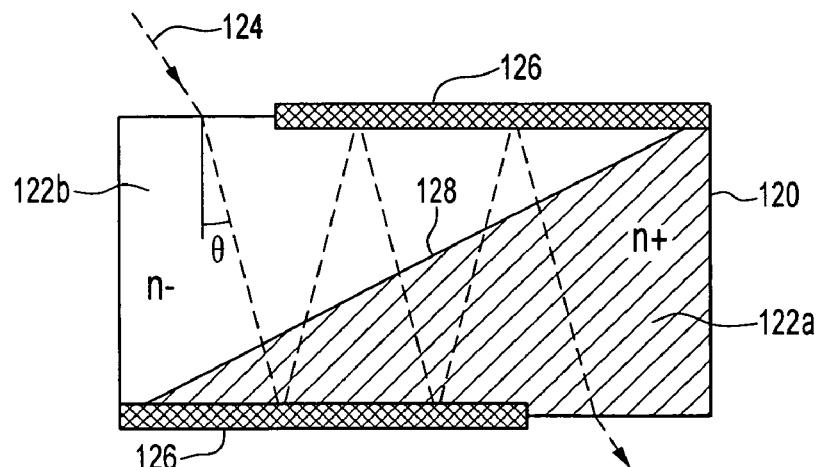
FIGS. 11A–11F are cross-sections illustrating domain patterns for multi-bounce deflection cells in accordance with preferred embodiments of the invention.
Figure 11B:
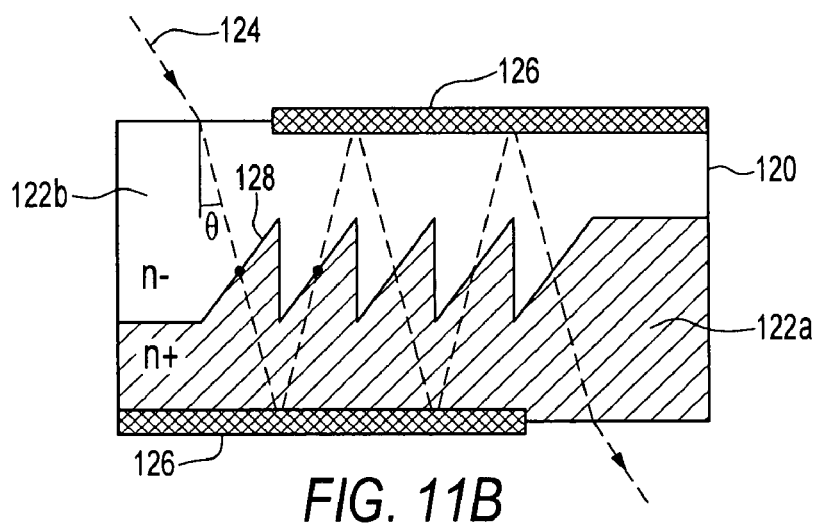
Figure 11C:
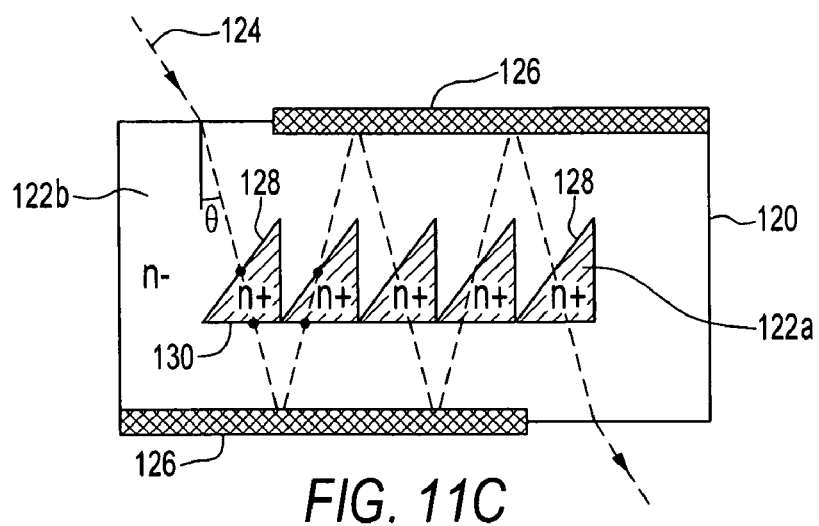
Figure 11D:
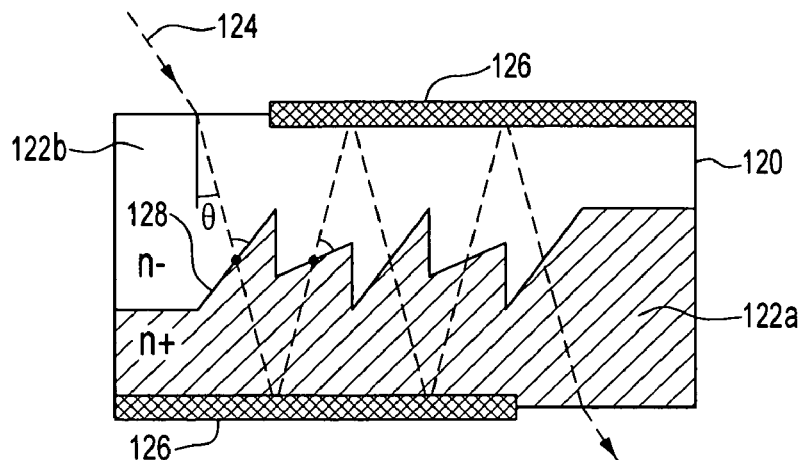
Figure 11E:
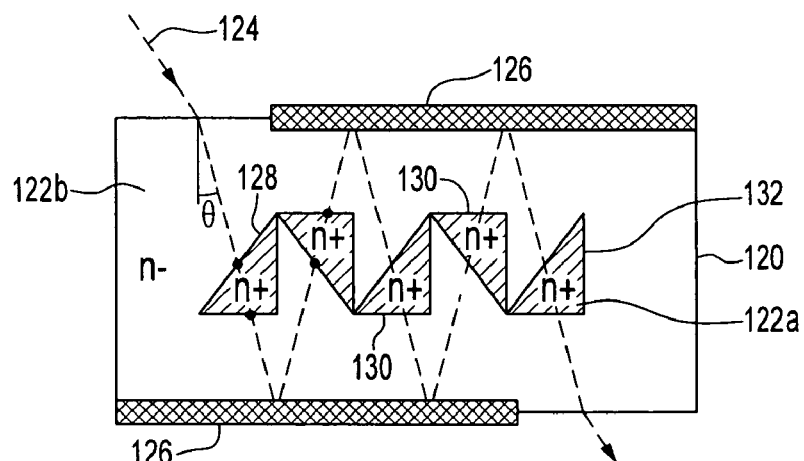
Figure 11F:
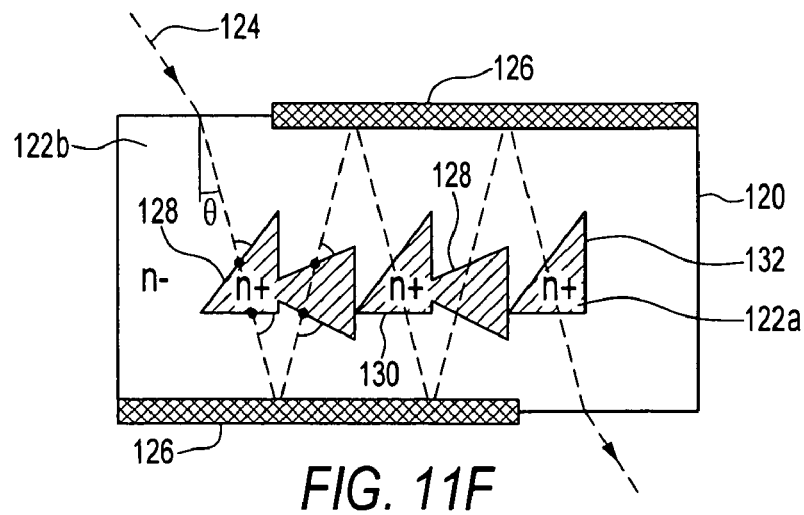

FIG. 11A shows a linear boundary between 122a and 122b, and is simple to manufacture. The remaining figures show different periodic functions as boundaries. Many patterns will achieve suitable deflection, including arbitrary or chaotic boundary patterns. It is preferable to use a pattern that achieves deflection symmetry, however. The symmetry is not present in FIGS. 11B and 11C because the larger angle of incidence of the second pass will cause greater deflection to occur during the second pass than the first. It is preferable, as in the other figures, to spread the deflection responsibility evenly over all the interfaces, rather than making deflection predominantly the result of a few large incidence angle refractions.

In achieving a practical cell, the length and number of deflections are limited. The permitted path for the optical beam is such that all vertical domain interfaces are avoided. Given proper alignment, an increasing applied voltage will cause the beam to deflect farther from the zero voltage path shown in FIGS. 11A–11B, and eventually it will either strike a vertical domain interface or fail to strike a diagonal interface. The longest path that avoids this defines the useful length of the deflection cell. Performance optimizations and velocity matching to a particular analog signal frequency band depend upon alignment of the domain interfaces and selection of a probe angle θ.

Figure 12:
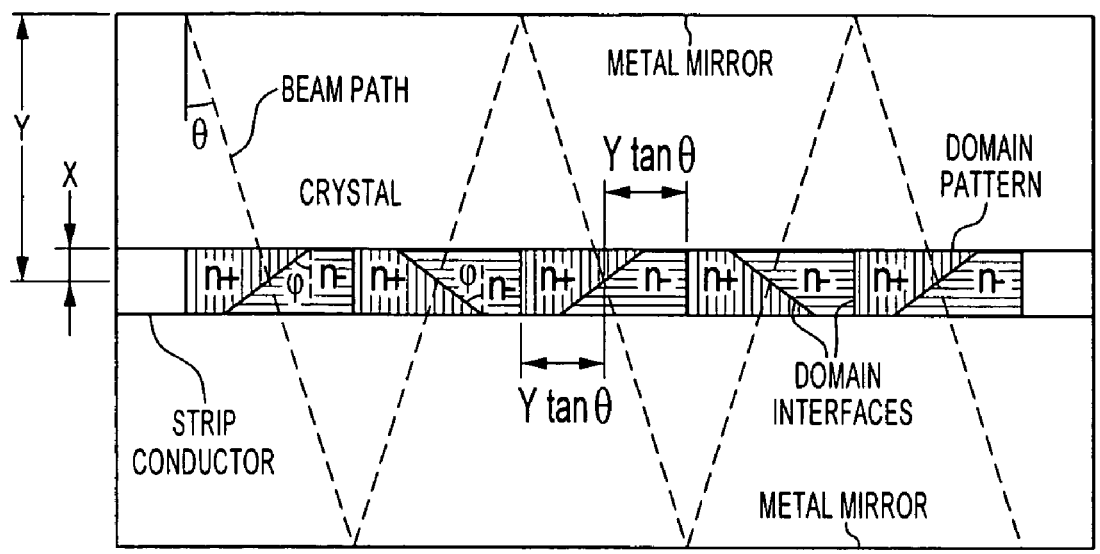
FIG. 12 shows a preferred domain interface pattern for the deflection cell of FIG. 10.

We will consider optimization issues with respect to the deflection cell 100 shown in FIG. 10. A first alignment issue is optimal spacing of the vertical domain interfaces. Assuming equal spacing, maximal clearance is achieved for a horizontal spacing of 2Y tan θ. Such a domain pattern is shown in FIG. 12. The unshaded areas outside of the shaded domain patterns in FIG. 12 are outside of the electric field and therefore do not undergo a change in refractive index, and these areas may be poled either n+ or n−. The spacing of the diagonal domain interfaces is set such that the zero voltage beam strikes the center of each diagonal interface.

Figure 13:
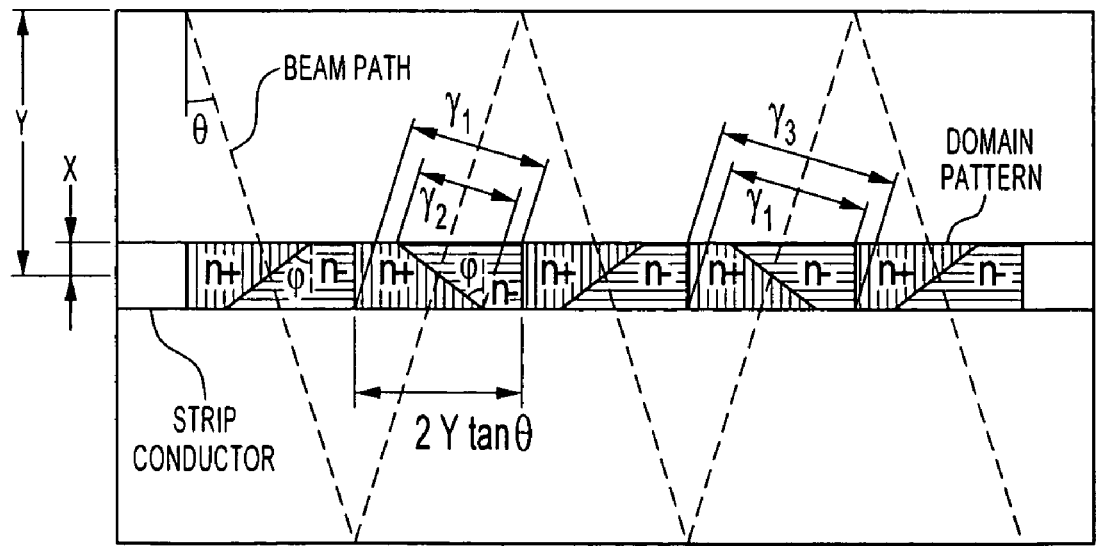
FIG. 13 shows the preferred domain interface pattern of FIG. 12, and illustrates an optimization.

A clearance width γ is the perpendicular width of the permitted path for a ray traveling at a given angle θ. FIG. 13 shows that there are two such clearance widths for the design of FIG. 12. $\gamma_1$ corresponds to the clearance width due to the vertical domain interfaces, whereas $\gamma_2$ is the clearance width due to the diagonal interfaces.

The clearance width of interest is the smaller of $\gamma_1$ and $\gamma_2$. It can be seen from FIG. 13 that the angles φ and θ will determine which is the smallest. Simple trigonometry can be used to formulate the clearance widths from FIG. 13:

$$\gamma_1 = 2X\left[\left(\frac{X}{Y}\right)^{-1} - 1\right]\sin\theta \qquad (7)$$

$$\gamma_2 = 2X(\sin\theta + \cos\theta\tan\varphi) \qquad (8)$$

(X, Y, θ, and φ are dimensions as shown in FIGS. 12 and 13.)

Optimal orientation and spacing of domain interfaces will produce the maximum possible deflection. Simulated trial beam traces have indicated that the best laser beam clearance is attained for this design when the dimensions are such that $\gamma_1 = \gamma_2$. Equating (7) with (8) and solving for the stripline ratio X/Y yields a useful design criterion for the geometry of FIG. 12:

$$\frac{X}{Y} = \frac{1}{2 + \frac{\tan\varphi}{\tan\theta}} \qquad (9)$$

This provides a method for optimal alignment.

It is interesting to note that if the ratio X/Y is selected for a particular deflection cell design, then equation (9) can be used to predict the optimal interface angle φ, θ, of course, is set by the crystal material.

To get the most deflection possible, one needs to decrease the interface angle φ. More specifically, one needs to drive the angles of incidence closer to the TIR angle. In this case, greater deflection is achieved per refraction, and the total deflection is increased despite a smaller number of refractions. For a given crystal width Y, the length of the crystal necessary to achieve maximum deflection increases with interface angle φ; i.e., the device aspect ratio becomes large for designs with minor angles of incidence. The stripline ratio X/Y also becomes smaller as the interface angle φ increases; thus, the stripline covers a smaller portion of the crystal surface.

Deflection symmetry suffers as φ gets small. This can be explained by the large angles of incidence. The design of FIG. 12 has some asymmetry inherent to its geometry. Referring to FIG. 12, each pass across the stripline produces two external refractions and one internal refraction when the voltage is applied in the appropriate polarity. Hence, there are twice as many external refractions as internal ones. When the polarity is opposite, each pass across the stripline produces one external refraction and two internal refractions. For this case, twice as many internal refractions occur. Asymmetry becomes negligible for the FIG. 12 device for large interface angles φ≈40–70 °.

In the deflector of FIG. 12, the interface angle φ could also be chosen in such a way as to maximize the symmetry of deflection. For example, the angles of incidence of the two refractions that correspond to entering and leaving the area under the stripline are equal, and both are either internal or external depending on the polarity of the applied signal. At this angle of incidence, a calculable difference between the deflection magnitude of an internal and external refraction exists. (p can be chosen such that the angle of incidence of the refraction at the diagonal interface results in a difference in internal and external deflection magnitudes that is twice that of the other refractions. This would result in deflection angles for the two polarities which are approximately symmetric. For the device of FIG. 12, θ=20°, φ=50°, produces symmetrical deflection. Of course, the ratio X/Y is then dictated by equation (9).

It is also desirable that the deflection produced by the device be linearly related to the applied voltage. If Snell's Law is used to predict deflections over the range of refractive index changes to be seen in the device, the voltage versus deflection curve can be calculated for a given angle of incidence. Ideally, this curve would be perfectly linear. In practice, this curve is highly linear for all angles of incidence except those large enough to approach total internal reflection.

A departure from ideal linearity occurs when angles of incidence in the device exceed about 60°. In the 80° to 85° range, there is a significant departure from linearity which must be accounted for in such a cell. Therefore, it is preferable to keep the angles of incidence in the deflector at 60° or less so that the output is approximately linear. Nonlinear outputs may be used, but must be accounted for in decoding the deflection into a digital value.

A deflector such as that shown in FIG. 12 may be constructed from single-crystal congruently-grown lithium tantalate, for example. The voltage level required to produce the desired electric field is inversely related to the crystal thickness. To minimize voltage requirements, this thickness should be as small as is practical for the other device dimensions. Ferroelectric domain inversion may be performed according to the principles of Large-Angle Electro-Optic Laser Scanner on LiTaO3 Fabricated by in situ Monitoring of Ferroelectric-Domain Micropatterning. Scrymgeour et al., Applied Optics, vol. 40, no. 34, pp. 6236–6241 (December 2001). Stripline electrodes may be applied to the top and bottom crystal faces using a sputtering technique. Two side edges of the device must be highly polished and given mirror coatings. The entrance and exit faces also need to be highly polished. Lack of parallelism of the mirrors, poor surface flatness, and imperfect domain interfaces can all be expected to cause adverse effects in the device, and should therefore be controlled during manufacture.

The device width should be chosen such that the path length of the optical beam through the device is short enough that the beam diameter does not increase significantly over this length. In other words, the dimensions must be such that the beam can be reasonably collimated over the path length of the beam through the device.

The beam diameter will dictate the device dimensions. This diameter must be much less than the clearance widths $\gamma_1$ and $\gamma_2$ in the plane parallel to the transmission line electrodes to allow clearance for the beam. A beam can be focused into the thickness of the device and the device used as a planar waveguide.

If a beam is focused down into a very thin crystal, and the crystal is used as a planar waveguide, then additional cladding layers may be necessary for good confinement. A waveguide may be formed in the top crystal surface, such as by the proton exchange fabrication method. Then, a SiO$_2$ cladding layer may be deposited on top of the planar waveguide, and the top electrode is sputter deposited on top of the cladding. The applied electric field can then be calculated by:

$$E_a = \frac{V}{d_{eff}} = \frac{V}{d_s + \frac{\varepsilon_s}{\varepsilon_c}d_c} \quad (10)$$

$d_s$ and $d_c$ are the thicknesses of the substrate and cladding layers respectively, whereas $\varepsilon_s$ and $\varepsilon_c$ are the relative permittivities of the substrate and cladding layers respectively. The voltage requirement to produce the same electric field over the same thickness is increased by adding cladding.

In all or any of the embodiments discussed above, additional optics may be integrated or used with the deflection cell to control one or both of the beam entry into and exit from the deflection cell, and to the affect the nature of the deflection achieved in the multi-bounce path within the deflection cell. For example, lenses may be incorporated into the deflection cell outside the boundary of the transmission line conductors used to apply the voltage to the deflection cell. Collimation, beam shaping, and focusing may be achieved. Additionally, optical geometries within the optical path in the deflection cell can serve to focus the optical beam and increase the deflection angle. As an example, the mirrors may be modified to present a curved reflection surface, which can enhance the magnitude of deflection. An exemplary embodiment deflection cell with integrated optics and optical geometries will now be discussed to illustrate these aspects of the invention.

Figure 14:
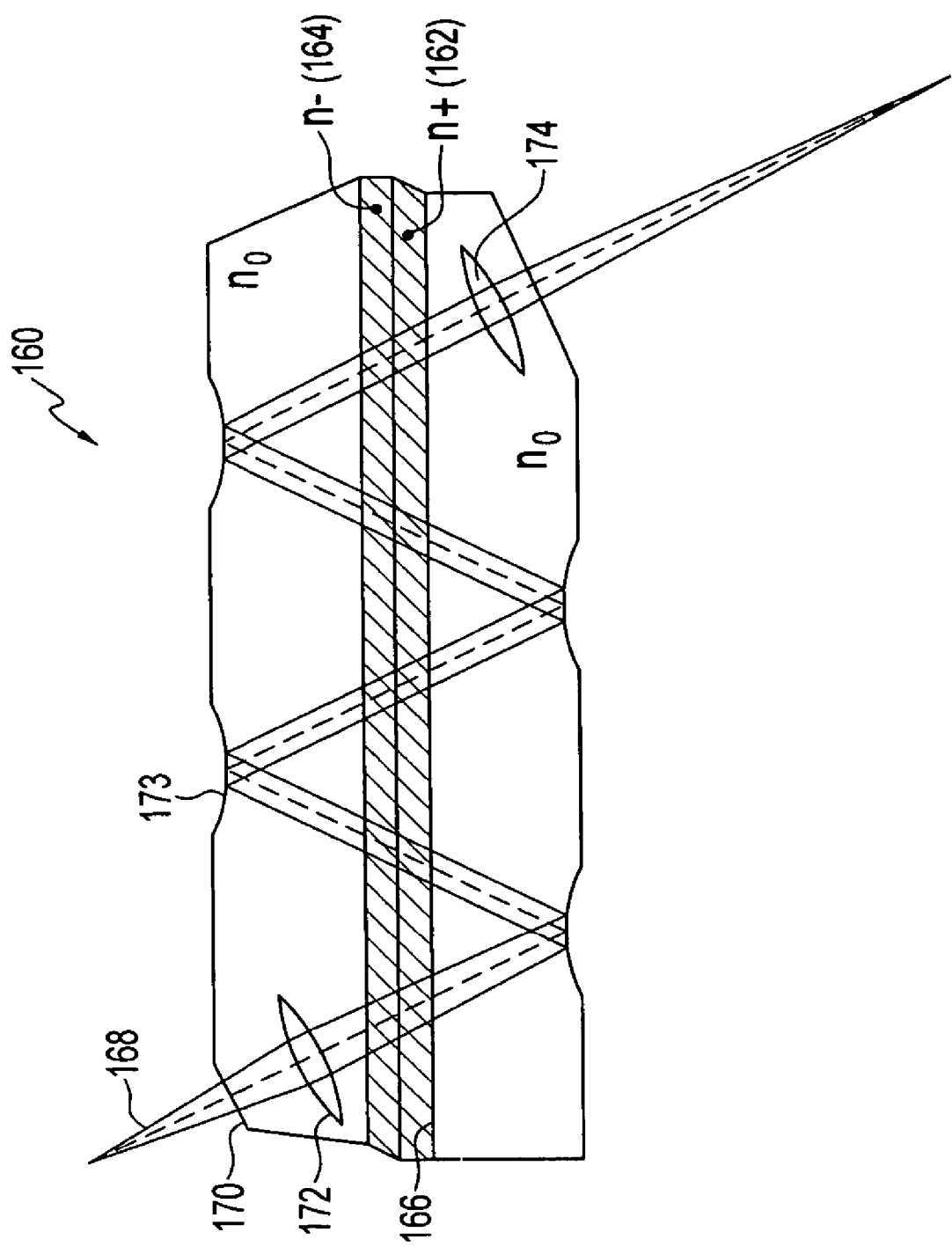
FIG. 14 is a schematic diagram of a preferred embodiment multi-bounce deflection cell with integrated optics and optical geometries.

FIG. 14 is a schematic diagram of a preferred embodiment multi-bounce deflection cell 160 with integrated optics and optical geometries. The deflection cell 160 includes a simple straight line division between n+ and n− poled sections 162, 164 of the crystal between opposing transmission line conductors 166. Areas outside the transmission line conductors 166 may be unpoled or poled, and are labeled no. A beam 168 enters an angled facet 170 of the crystal and is focused and/or collimated by one or more entrance lenses 172 formed in the material of the crystal. The multi-bounce path of the beam 168 crosses the interface of the poled sections a number of times and is deflected in accordance with a signal applied to the transmission line conductors 166, as has been explained with regard to the other embodiments. Mirrors 170 in the deflection cell 160 include convex geometries 173 formed at points of reflection of the beam 168. The convex geometries 173 enhance the amount of deflection. An additional exit lens or lenses 174 accepts the deflected beam 168 and focuses the defelected beam 168. In preferred embodiment A/D converters, the lens 168 focuses the deflected beam toward, e.g., collection optics, a spatial filter, or a spatial detector as in FIGS. 4A–4D.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. An optical probe analog to digital converter comprising:
   a light source emitting a light beam;
   a multi-bounce optical deflector that accepts the output of said light beam, slows its phase velocity, and deflects the output of said light beam in angular variations that depend upon a magnitude of an analog signal to be converted, said deflector having at least $2^N$ angular variations corresponding to an analog to N-bit digital conversion; and
   an optical detection system for translating said $2^N$ angular variations into a N bit parallel output encoding $2^N$ digital bits.

2. The analog to digital converter of claim 1, wherein said optical detection system comprises a detector array that produces an N-bit parallel output having a unique value for each of said $2^N$ angular variations.

3. The analog to digital converter of claim 2, wherein said detector array includes N patterned sets of detectors, each set patterned for coding one of said N bits with the sets together establishing a $2^N$ parallel output having a unique bit value for each of said $2^N$ variations.

4. The analog to digital converter of claim 2, wherein:
said $2^N$ variations include an angular variation corresponding to no deflection.

5. The analog to digital converter of claim 4, wherein:
said $2^N$ angular variations code a zero value and $2^{N-1}$ positive values and said optical detection system translates an additional $2^{N-1}$ angular variations to code $2^{N-1}$ negative values.

6. The analog to digital converter of claim 5, wherein said optical detection system further encodes a negative/positive indication bit depending upon the angular deflection of the light beam.

7. The analog to digital converter of claim 6, wherein said optical detection system includes a detector array having N patterned sets of detectors, each set patterned for coding one of said N bits with the sets together establishing a $2^N$ parallel output having a unique bit value for each of said 2angular variations, and said detector array further includes an N+1 detector set to code one of an angular variation indicating one of said $2^{N-1}$ positive values and an angular variation indicating one of said $2^{N-1}$ positive values.

8. The analog to digital converter of claim 1, wherein said optical detection system comprises:
a spatial filter having a unique N element filter pattern for each of said $2^N$ angular variations; and
N optical detectors for detecting the filter pattern and outputting a N-bit digital value corresponding to the filter pattern.

9. The analog to digital converter of claim 8, wherein the optical detection system further comprises an optical collection system disposed between said spatial filter and said N optical detectors to collect light passing said spatial filter and direct the same to said N optical detectors.

10. The analog to digital converter of claim 8, wherein:
said spatial filter comprises apertures arranged in N rows and $2^N$ columns, each of said columns encoding an N bit digital value with the rows coding bits from a least significant bit to a most significant bit; and
said detector array comprises a single column of N detectors arranged from least significant bit to most significant bit.

11. The analog to digital converter of claim 8, wherein:
said spatial filter comprises apertures arranged in N rows and $2^N$ columns, each of said columns encoding an N bit digital value with the rows coding bits from a least significant bit to a most significant bit; and
said N optical detectors comprise active detectors corresponding to the apertures and arranged in N rows and $2^N$ columns, said rows being arranged from a least significant bit to a most significant bit.

12. The analog to digital converter of claim 1, wherein said light source comprises a pulsed laser and said optical detection system converts pulses deflected by said optical deflector to N-bit digital electrical pulses.

13. An optical probe analog to digital converter comprising:
a light source producing a light beam;
an optical deflector for reducing the phase velocity of the light beam and deflecting the light beam in an angle proportional to the magnitude of an analog signal to be converted; and
optical detection means for producing a parallel N bit digital output, wherein the digital output depends upon the deflection angle of the light beam.

14. An optical probe analog to digital converter comprising:
an optical detection system including N rows corresponding to N bits to be encoded and $2^N$ columns corresponding to $2^N$ digital values to be encoded;
a light source producing a light beam having a shape that spans N rows of said optical detector system but only one column or less of said optical detection system; and
an optical deflector for slowing the effective phase velocity of said light beam and deflecting said light beam over the range of the $2^N$ columns in response to an analog signal to be converted.

15. The analog to digital converter of claim 14, wherein said rows are arranged to code bits from a least significant to most significant bit.

16. The analog to digital converter of claim 15, wherein said optical detection system comprises an N row and $2^N$ column spatial filter that patterns the light beam into a patterns such that, when the beam is deflected to one of said $2^N$ columns, light passes onto rows that would have "1" bits for the particular value being encoded, wherein the pattern blocks all rows for a value of zero and passes all rows for a digital value $2^{N-1}$.

17. The analog to digital converter according to claim 14, wherein said optical detection system further comprises:
N light detectors arranged in a N row column; and
an optical collection system to collect light direct the same to said N light detectors.

18. The analog to digital converter according to claim 17, further comprising $2^{N-1}$ additional columns in said spatial filter to encode negative digital values.

19. A method for performing an analog to digital conversion of an analog signal, the method comprising steps of:
applying the analog signal to an optical deflector;
passing a light beam through the optical deflector;
slowing the phase velocity of the light beam during said step of passing; and
outputting a digital value that depends upon the angular deflection of the light beam.

20. The method according to claim 19, further comprising a step of patterning the light beam into $2^N$ N-bit digital bit patterns, wherein the patterns change depending upon the amount of angular deflection of the light beam.

21. The method according to claim 19, further comprising a step of detecting the patterns.

* * * * *

UNITED STATES PATENT AND TRADEMARK OFFICE
CERTIFICATE OF CORRECTION

PATENT NO. : 7,233,261 B2  Page 1 of 1
APPLICATION NO. : 10/949030
DATED : June 19, 2007
INVENTOR(S) : Nunnally et al.

It is certified that error appears in the above-identified patent and that said Letters Patent is hereby corrected as shown below:

In the Issued Patent:

Column 12, line 10, please delete "$\theta_i \langle sin^{-1}\left[\frac{1}{n_0}\left(\frac{1}{n_L^2}+\frac{1}{n_H^2}\right)^{\frac{1}{2}}\right]$" and insert -- $\theta_i \langle sin^{-1}\left[\frac{1}{n_0}\left(\frac{1}{n_L^2}+\frac{1}{n_H^2}\right)^{-\frac{1}{2}}\right]$ -- therefor.

Column 14, line 5, please delete "$\gamma_{=\gamma 2}$" and insert -- $\gamma_1 = \gamma_2$ -- therefor.

Column 14, line 54, please delete "(p" and insert --φ-- therefor.

Column 17, line 19, please delete "2angular" and insert --$2^N$angular-- therefor.

Signed and Sealed this

Twentieth Day of November, 2007

JON W. DUDAS
*Director of the United States Patent and Trademark Office*